United States Patent [19]

Bergonzoni

[11] Patent Number: 4,997,782
[45] Date of Patent: Mar. 5, 1991

[54] FABRICATION OF CMOS INTEGRATED DEVICES WITH REDUCED GATE LENGTH AND LIGHTLY DOPED DRAIN

[75] Inventor: Carlo Bergonzoni, Arcore, Italy

[73] Assignee: SGS-Thomson Microelectronics s.r.l., Italy

[21] Appl. No.: 386,189

[22] Filed: Jul. 28, 1989

[30] Foreign Application Priority Data

Aug. 4, 1988 [IT] Italy ................... 83655 A/88

[51] Int. Cl.$^5$ .................. H01L 27/092; H01L 21/265
[52] U.S. Cl. ........................ 437/44; 437/34; 437/41; 437/57; 437/27; 357/23.3
[58] Field of Search .................. 437/34, 41, 44, 56, 437/57; 357/23.3

[56] References Cited

U.S. PATENT DOCUMENTS

| | | | |
|---|---|---|---|
| 4,530,150 | 7/1985 | Shirato | 437/44 |
| 4,577,391 | 3/1986 | Hsia et al. | 437/44 |
| 4,590,663 | 5/1986 | Haken | 437/57 |
| 4,753,898 | 6/1988 | Parrillo et al. | 437/44 |
| 4,764,477 | 8/1988 | Chang et al. | 437/34 |
| 4,771,014 | 9/1988 | Liou et al. | 437/34 |

Primary Examiner—Olik Chaudhuri
Assistant Examiner—M. Wilczewski
Attorney, Agent, or Firm—Pollock, Vande Sande & Priddy

[57] ABSTRACT

By means of a single additional masking step lightly doped drain regions are formed in p-channel and n-channel CMOS transistors. The improved CMOS process comprises, after having formed the gates within the active areas and before forming spacers along the sides of the gate, implanting over the entire unmasked surface of the front of the device formed on a silicon substrate of a first polarity a quantity of dopant of a second polarity, identical to the well region polarity, sufficient to form lightly doped drain regions in transistors with a channel of said second polarity, forming a first time the mask for implantations of said first polarity and implanting the relative dopant in a dose sufficient to compensate and invert completely the previous implantation and to form lightly doped drain regions in transistors with a channel of said first polarity formed within the well region. The fabrication process may then continue in a conventional way.

4 Claims, 4 Drawing Sheets

FABRICATION OF CMOS INTEGRATED DEVICES WITH REDUCED GATE LENGTH AND LIGHTLY DOPED DRAIN

BACKGROUND OF THE INVENTION

1. Field of the invention

The present invention relates to an improved fabrication process for CMOS integrated devices having a reduced gate length and lightly doped drain regions of transistors of both polarities.

2. Description of the prior art

At present in CMOS fabrication processes with a gate length of about a micron ($\mu$m) or less, the p-channel transistors are fabricated with dimensions greater than the minimum dimensions proper of the fabrication process because the high diffusivity of the p-type dopant commonly used for p+ junctions, typically boron, produces an effective channel length sensibly reduced in respect to the one obtained in n-channel transistors having the same gate length, when using conventional heat treatments. In this situation the p-channel transistors are much more subject to develop malfunctioning problems, such as the punch-through phenomenon, than n-channel transistors especially in devices destined to operate with a relatively high supply voltage (12 V), and therefore must necessarily be fabricated with adequately increased dimensions, thus reducing the density of integration which may be achieved. In the alternative the problem may be overcome by means of the known technique of forming lightly doped drain regions close to the sides of the transistors' gate. The use of lightly doped drain regions allows to exploit the minimum dimensions of definition of the fabrication process also for p-channel transistors, by spacing apart the p+ diffusions by means of spacers of dielectric material which are purposely formed on the sides of the gate, according to well known techniques. The formation of lightly doped drain regions commonly implies the repetition of the n+ and p+ implantations maskings in order to repeat the implantation of the relevant dopants before and after forming the spacers. This increases substantially fabrication costs because of the two additional masking operations which are required in respect to a standard process (without the formation of lightly doped drain regions, or LDD) or to a process wherein the formation of said lightly doped drain regions takes place on transistors of a single polarity.

OBJECTIVE OF THE INVENTION

Objective of the present invention is an improved fabrication process for integrated CMOS devices through which it is possible to form n-channel and p-channel transistors both provided with lightly doped drain regions (LDD) by means of a single additional masking step.

BRIEF DESCRIPTION OF THE DRAWINGS

The FIGS. 1 to 8 show the essential steps of a fabrication process in accordance with the present invention. The FIGS. 9–10 show an alternative order of carrying out relevant steps of the process.

DESCRIPTION OF A PREFERRED EMBODIMENT

Figure 1:
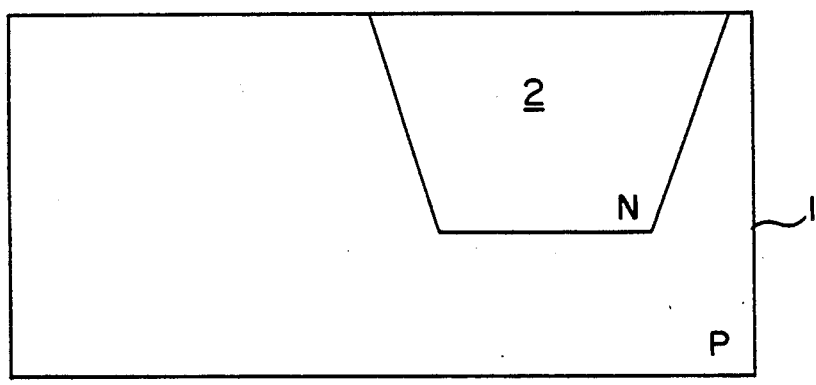
Figure 2:
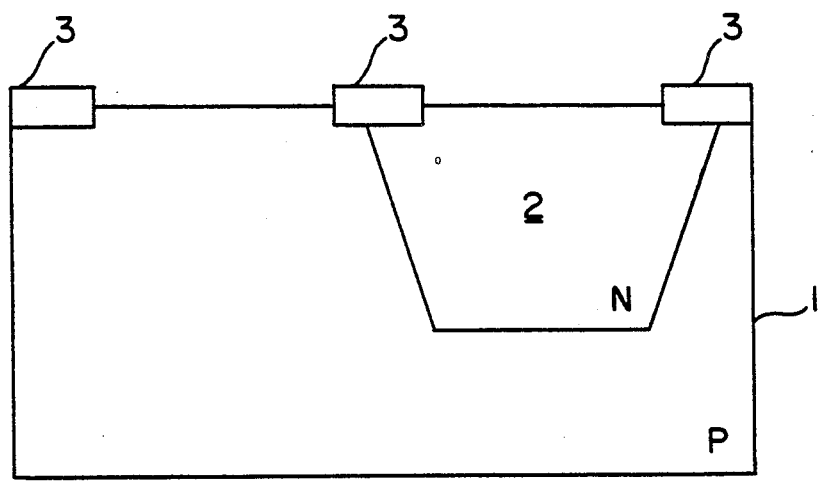
Figure 3:
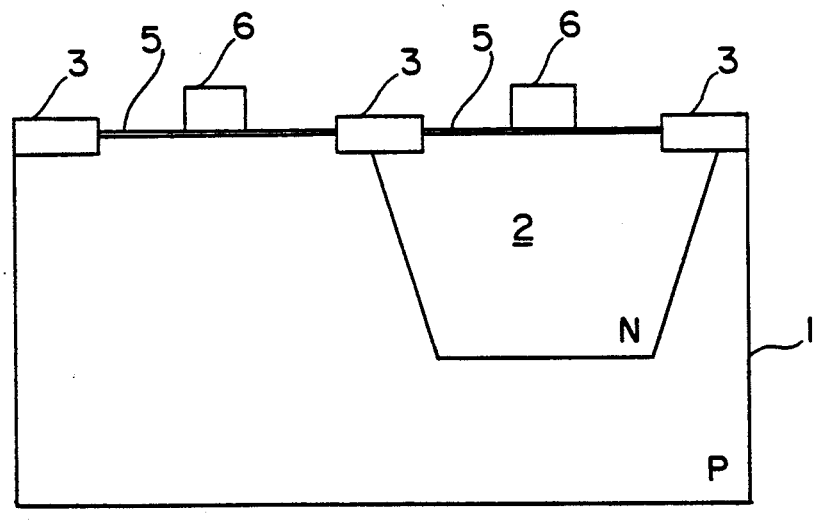
Figure 4:
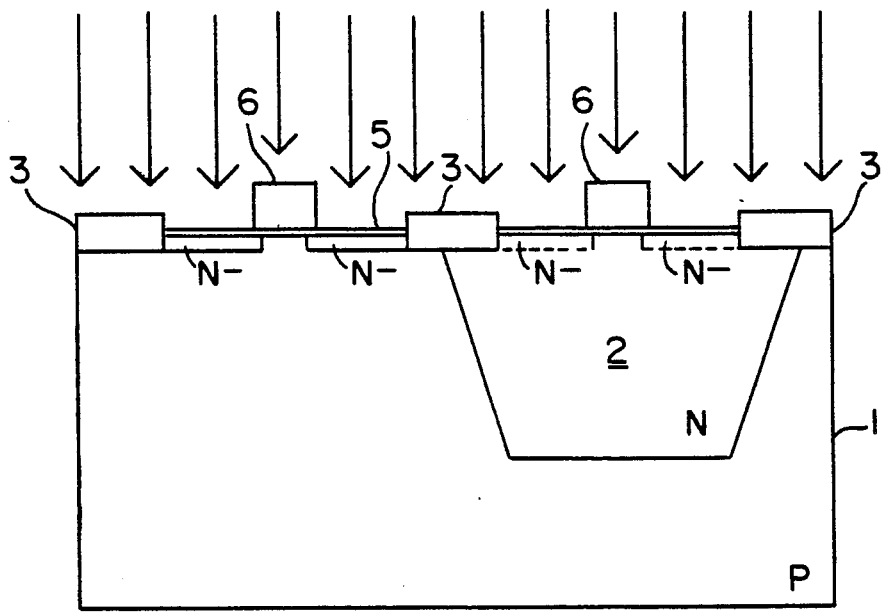
Figure 5:
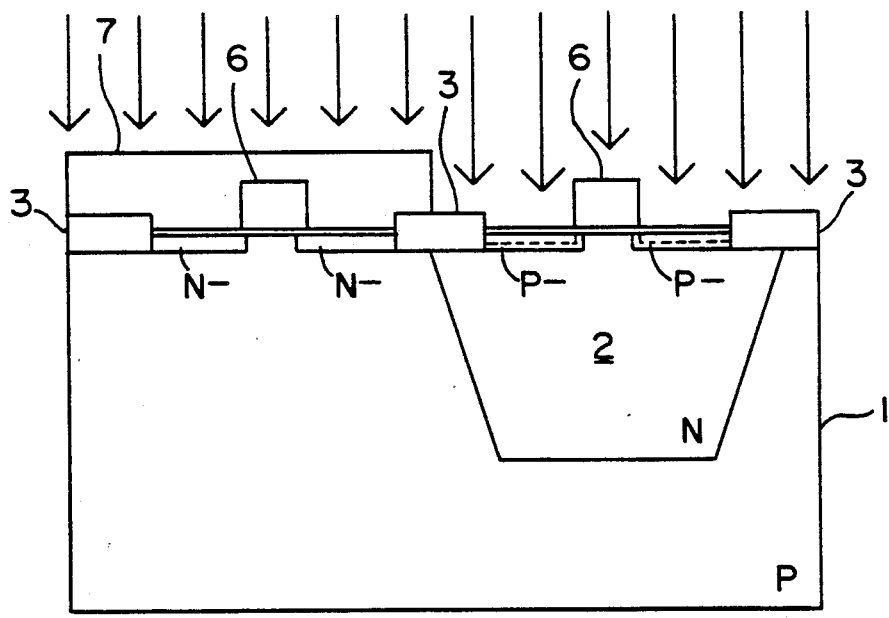
Figure 6:
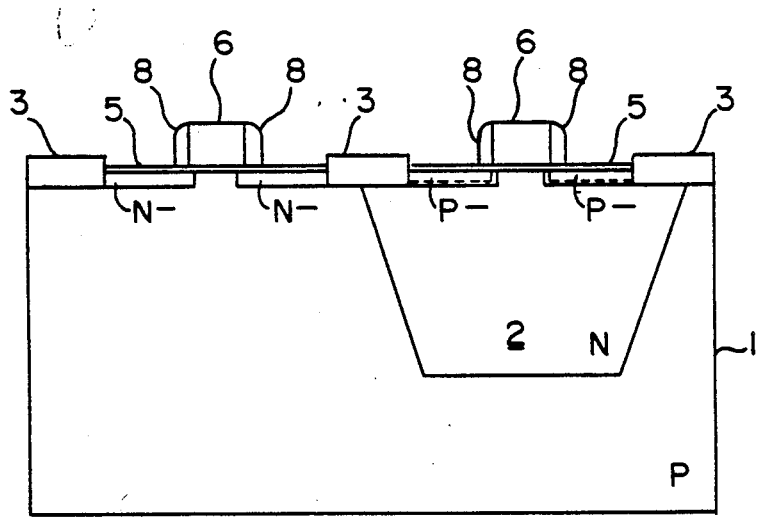
Figure 7:
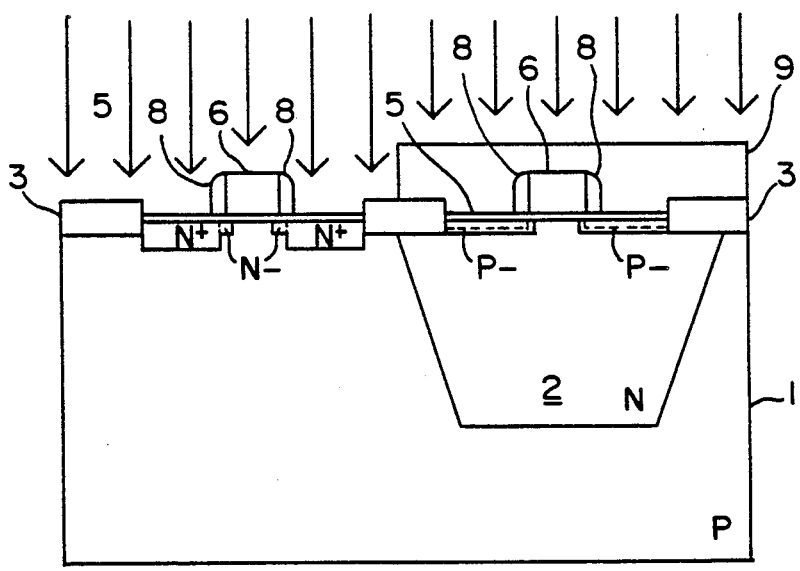
Figure 8:
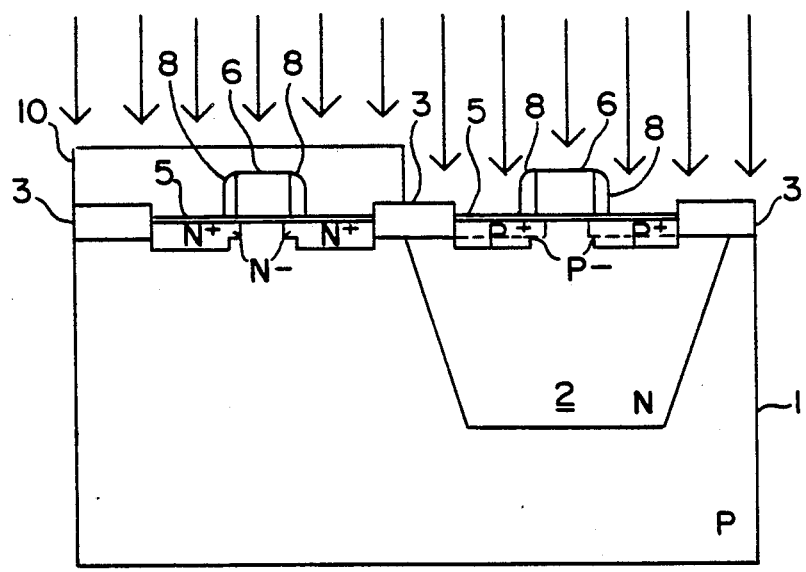

In the case of fabricating n-well architecture devices, the process of the invention comprises the following steps:

1. formation of the n-well diffusion (2) in a monocrystalline, p-type silicon substrate (1), according to common practices (FIG. 1);
2. definition on the front of the wafer of the active areas by growing an isolation field oxide layer (3) among adjacent active areas, according to common practices (FIG. 2);
3. growth of a gate oxide layer (5) over the active areas of the device, according to common practices; and
4. deposition, doping and definition of a polycrystalline silicon gate layer (6) inside the active areas, in accordance with common practices (FIG. 3);
5. unmasked implantation on the entire front of the device of an n-type dopant for forming n− type lightly doped drain regions (LDD) (FIG. 4);
6. first formation of the "p+ mask" (7) and implantation of a p-type dopant on the active areas of p-channel transistors, in a dose sufficient to compensate and invert J completely the preceding n− implantation in order to form p− type lightly doped drain regions (FIG. 5);
7. deposition and etching of a dielectric material (e.g. silicon oxide) for forming lateral spacers (8), according to common practices (FIG. 6);
8. formation of the "n+ mask" (9) and implantation of an n-type dopant for forming n+ junctions, according to common practices (FIG. 7);
9. second formation of the p+ mask (10) and implantation of a p-type dopant for forming p+ junctions, according to common practices (FIG. 8);
10. formation of the contacts and of the interconnecting lines and execution of the finishing steps of the fabrication process, according to common practices.

Of course, as it will be evident to the skilled technician, the process of the invention is applicable also for fabricating devices with different architectures such as for example p-well and twin-well devices by appropriately inverting polarities. Moreover any technique for defining the active areas and for forming the isolation structure (field oxide, buried oxide, etc.) as well as for forming gates with polycrystalline silicide or other conducting material or with stacked layers of polycrystalline silicon and silicide and various known techniques for forming the junctions, such as the use of particular dopant species, of self-aligned silicides and for forming spacers with materials different from the silicon oxide may be satisfactorily employed in the fabrication process of the invention.

Figure 9:
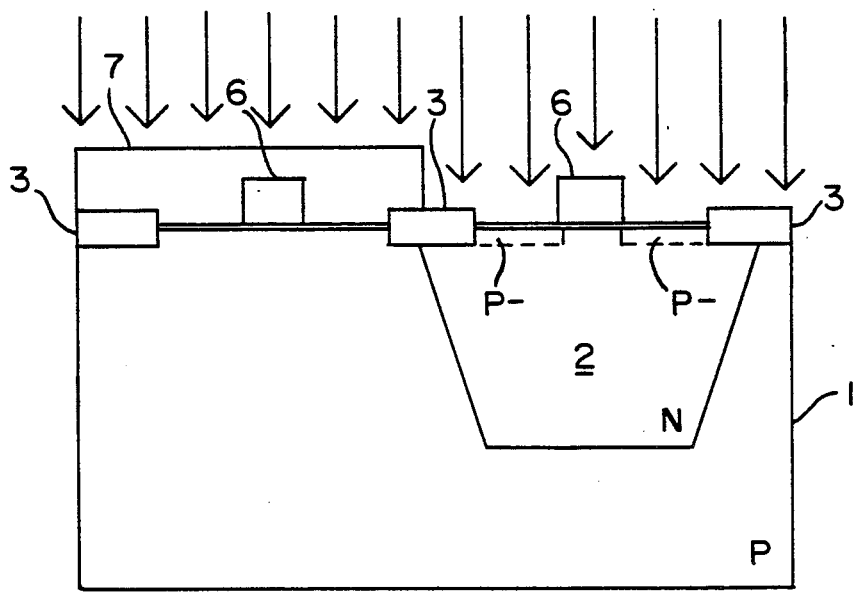
Figure 10:
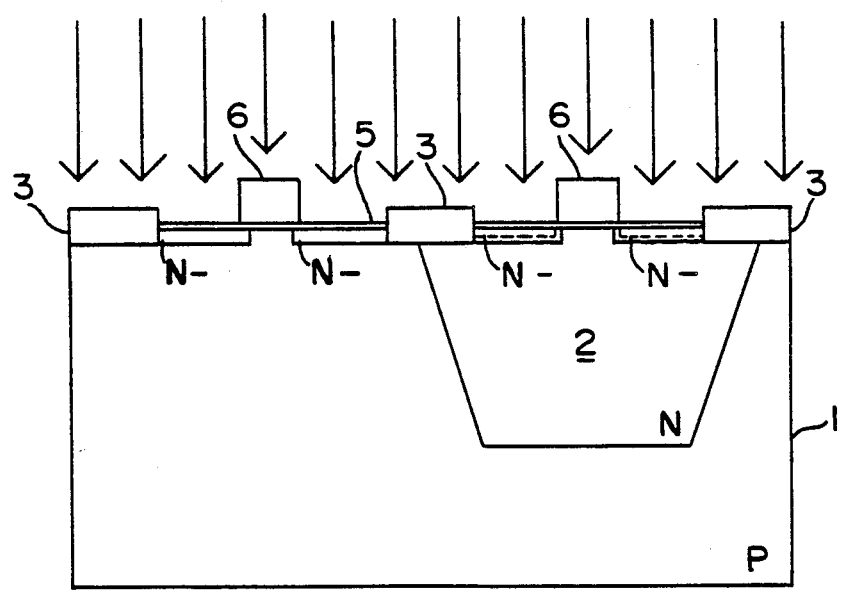

The 5. and 6. steps of the process may obviously also be carried out in a different chronological order and/or by inverting the polarities of the mask used and of the dopants, as long as the compensation of the second implantation is ensured, as depicted in FIGS 9 and 10.

It is essential that the implantations relative to the steps 5 and 6 which characterize the improved fabrication process of the invention be carried out so that the dose of the first implanted dopant on the active areas of n-channel transistors as well as on the active areas of p-channel transistors is completely compensated and inverted by the subsequent masked implantation on the transistors of one specific channel polarity, in order that the total active concentration of the dopant be adequate to form an efficient lightly doped drain region (LDD)

having an effective concentration of about $10^{18}$ atoms per cubic centimeter.

EXAMPLE

Integrated p-channel transistors with a gate length of 0.8 μm, with different combinations of n⁻ and p⁻ implantations have been formed on a p-type monocrystalline silicon by means of a polycrystalline silicon gate CMOS fabrication process, modified in accordance with the present invention in respect to a standard sequence of process steps while following substantially standard procedures for carrying out the different process steps.

Over an n⁻ well region formed by an unmasked implantation of phosphorus in a dose of $3 \times 10^{13}$ atoms per cm², carried out at 60 KeV (step 5 of the process sequence described above), different boron doses (p⁻) utilizing $BF_2$, respectively of 4, 7 and $10 \times 10^{13}$ atoms per cm² and implanted at 60 KeV (step 6 of the process sequence described above), have been tested.

In all three cases the p-channel transistors so formed proved to be satisfactorily functioning up to the contemplated maximum supply voltage of 12 V and had threshold voltages of about −1.1 V in a linear zone.

Transistors made with the same process but with a gate length reduced to 0.6 μm were also operating satisfactorily at a lower supply voltage of 5 V and the breakdown voltage of the p+ junction was considerably higher in respect to that of a p+ junction without the lightly doped drain structure formed in accordance with the present invention.

What I claim is:

1. A fabrication process for CMOS devices integrated on a doped monocrystalline silicon substrate of a first type of conductivity wherein deep well diffusions of a second type of conductivity are formed within which transistors having a channel of said second conductivity are formed and outside which transistors having a channel of said first conductivity are formed, comprising forming a well region of said second conductivity in a monocrystalline silicon substrate of said first conductivity, forming isolation structures for defining active areas on the front of the devices, forming a gate oxide layer at least over said active areas, forming a gate over an isolating gate oxide layer within said active areas belonging to n-channel and to p-channel transistors, forming lightly doped drain regions in transistors of both types of conductivity close to the sides of said gate, forming spacers of a dielectric material along the side of said gate, masking and implanting an n-type dopant for forming heavily doped drain regions in n-channel transistors and masking and implanting a p-type dopant for forming heavily doped drain regions in p-channel transistors, opening and forming contacts and interconnecting lines, characterized by the fact that said lightly doped drain regions are formed by means of a single masking operation in transistors of both channel conductivity types by carrying out, after forming said gate and before forming said spacers, the following steps:

(a) implanting without utilizing any mask a dopant of one of said first or second conductivity type in a dose sufficient to form lightly doped drain regions of the respective type of conductivity in all said active areas;

(b) masking the active areas of transistors with a channel conductivity of the opposite type of the dopant implanted without masking in the preceding step (a); and (c) implanting a dopant of an opposite type of conductivity of the dopant implanted in a step (a) in a dose sufficient to compensate and invert the conductivity in unmasked active areas thus forming lightly doped drain regions of opposite conductivity type therein.

2. The process of claim 1 wherein the lightly doped drain regions have an effective concentration of about $10^{18}$ atoms per cubic centimeter.

3. A fabrication process for CMOS devices integrated on a doped monocrystalline silicon substrate of a first type of conductivity wherein deep well diffusions of a second type of conductivity are formed within which transistors having a channel of said second conductivity are formed and outside which transistors having a channel of said first conductivity are formed, comprising forming a well region of said second conductivity in a monocrystalline silicon substrate of said first conductivity, forming isolation structures for defining active areas on the front of the devices, forming a gate oxide layer at least over said active areas, forming a gate over an isolating gate oxide layer within said active areas belonging to n-channel and to p-channel transistors, forming lightly doped drain regions in transistors of both types of conductivity close to the sides of said gate, forming spacers of a dielectric material along the sides of said gate, masking and implanting an n-type dopant for forming heavily doped drain regions in n-channel transistors and masking and implanting a p-type dopant for forming heavily doped drain regions in p-channel transistors, opening and forming contacts and interconnecting lines, characterized by the fact that said lightly doped drain regions are formed by means of a single masking operation in transistors of both channel conductivity types by carrying out, after forming said gate and before forming said spacers, the following steps:

a. masking the active areas of transistors with a channel conductivity of one of said first and second conductivities;

b. then implanting a dopant of the same conductivity of said channel conductivity and removing said mask;

c. and then implanting without utilizing any mask a dopant of opposite conductivity to said channel conductivity and in a dose sufficient to form lightly doped drain regions of the respective conductivity type in said previously masked active areas; and wherein the dose of said dopant implanted in step (b) is sufficient to compensate for the unmasked implantation of the dopant in step (c) in order to form lightly doped drain regions of respective conductivity type in the active areas of transistors with a channel of opposite conductivity.

4. The process of claim 3 wherein the lightly doped drain regions have an effective concentration of about $10^{18}$ atoms per cubic centimeter.

* * * * *